United States Patent
Wang et al.

(10) Patent No.: US 7,284,224 B2
(45) Date of Patent: Oct. 16, 2007

(54) PRINTED CIRCUIT BOARD AND METHOD OF MAKING THE SAME

(75) Inventors: Ping Wang, Shenzhen (CN); Wei-Xing Zhong, Shenzhen (CN)

(73) Assignees: Hong Fu Jin Precision Industry (Shenzhen) Co., Ltd., Boa-an District, Shenzhen, Guangdong Province (CN); Hon Hai Precision Industry Co., Ltd., Tu-Chen, Taipei Hsien (TW)

( * ) Notice: Subject to any disclaimer, the term of this patent is extended or adjusted under 35 U.S.C. 154(b) by 0 days.

(21) Appl. No.: 11/296,068

(22) Filed: Dec. 7, 2005

(65) Prior Publication Data
US 2006/0118328 A1    Jun. 8, 2006

(30) Foreign Application Priority Data
Dec. 7, 2004    (CN) ................ 2004 1 0077411

(51) Int. Cl.
*G06F 17/50*    (2006.01)
*G06G 7/62*    (2006.01)

(52) U.S. Cl. ......................... 716/15; 703/13

(58) Field of Classification Search ................ 716/15, 716/4; 703/13
See application file for complete search history.

(56) References Cited

U.S. PATENT DOCUMENTS 7,171,645 B2 *    1/2007    Ito et al. ................. 716/19
2003/0196181 A1 *    10/2003    Sano et al. .............. 716/4

* cited by examiner

*Primary Examiner*—Stacy A Whitmore
(74) *Attorney, Agent, or Firm*—Morris Manning Martin LLP; Tim Tingkang Xia, Esq.

(57) ABSTRACT

A printed circuit board (PCB) includes a base board, a conductive pattern arranged on the base board, and a number of metal pads arranged on the base board. The conductive pattern includes a number of vias and traces. The metal pads are evenly arrayed where there is a sparsity of vias and traces to balance a current during a plating process for achieving an even plating thickness. A method of designing the PCB includes: simulating a PCB with electronic components using a software, simulating vias, traces, and metal pads, and testing the electrical characteristics of the whole simulation. If the simulated PCB fails testing then it is redesigned. Once a simulated PCB passes testing then it is ready to be manufactured.

9 Claims, 3 Drawing Sheets

PRINTED CIRCUIT BOARD AND METHOD OF MAKING THE SAME

BACKGROUND

1. Field of the Invention

The present invention relates to a printed circuit board (PCB), and a method of designing the PCB, which prevents an uneven plating thickness on the PCB.

2. General Background

Generally, a conventional fabrication method of a PCB includes etching a copper foil on a polymer layer, drilling holes, electroplating, and trimming, etc. A plurality of traces is left after etching the copper foil. The PCB acts as a conductive body for a plurality of electronic components, and the PCB has strength to act as a supporting body for the electronic components.

Referring to FIG. 3, a conventional PCB design often results in having a dense concentration of traces in some areas, and a sparse concentration in other areas and a plurality of vias is arranged unevenly therein. Therefore, during plating, more current passes through the area of dense traces, than through the area of sparse traces. Thus, an uneven plating thickness occurs on the PCB, that is, larger plating thickness occurs on the inner walls of the vias located in the area of dense traces, and lesser plating thickness occurs on the inner walls of the vias located in the area of sparse traces. The plating thickness of the inner walls of the vias must reach a certain standard in order to satisfy the requirement of conductivity of the vias. In the area of sparse traces, the plating thickness of the inner walls of the vias may not be thick enough or even worse, not plated. In this situation, the PCB may be useless.

What is needed, therefore, is a PCB and a method of designing the PCB, which prevents an uneven plating thickness on the PCB.

SUMMARY

An exemplary printed circuit board (PCB) includes a base board, a conductive pattern arranged on the base board, and a number of metal pads arranged on the base board. The conductive pattern includes a number of vias and traces. The metal pads are arrayed evenly where there is a sparsity of vias and traces to balance a current during a plating process for achieving an even plating thickness.

A method of designing the PCB includes: simulating a PCB with electronic components using software, simulating vias, traces, and metal pads, and then testing the electrical characteristics of the simulated PCB and its electronic components. If the PCB fails testing then it is redesigned. Once a simulated PCB design passes testing then it is ready to be manufactured.

Other advantages and novel features will become more apparent from the following detailed description when taken in conjunction with the accompanying drawings, in which:

DETAILED DESCRIPTION OF THE EMBODIMENTS

Figure 1:
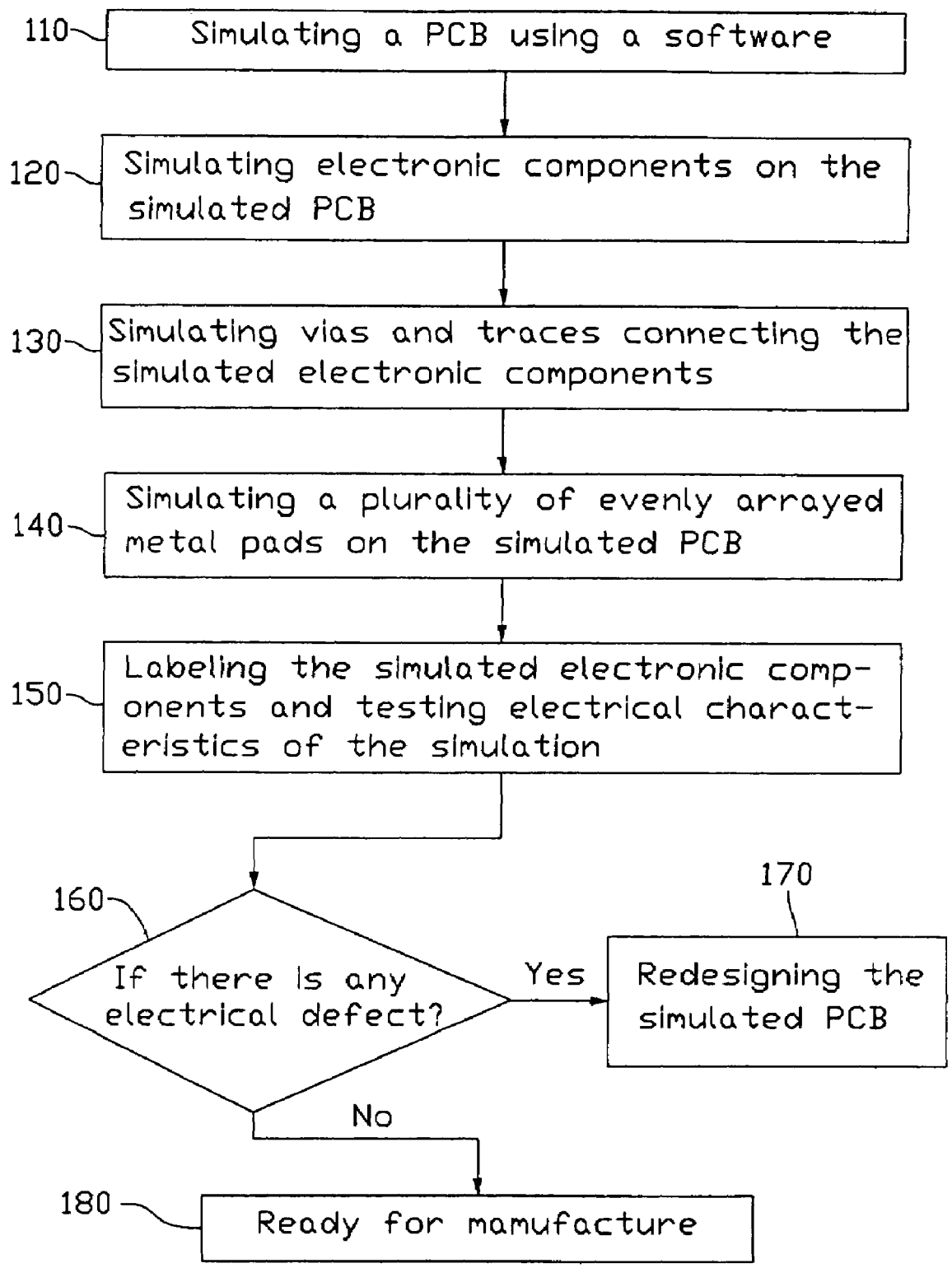
FIG. 1 is a flow chart of a method of designing a PCB in accordance with a preferred embodiment of the present invention.

Referring to FIG. 1, a method of designing a PCB in accordance with a preferred embodiment of the present invention includes the following steps.

Step 110: providing a PCB layout software, simulating a PCB using the software, the simulated PCB being in a certain proportion to a real PCB;

Step 120: simulating a plurality of electronic components on the simulated PCB, the simulated electronic components being simulated corresponding to the size and structure of real electronic components of the real PCB;

Step 130: simulating vias and traces connecting the simulated electronic components according to the actual component relationship of the real PCB;

Step 140: simulating a plurality of metal pads on the simulated PCB where there is a sparsity of traces and components, the metal pads being so arranged as to be evenly arrayed and capable of balancing the current during plating process;

Step 150: labeling the simulated electronic components and testing the electrical characteristics of the whole simulation using the software;

Step 160: the software calculating whether there are any electrical defects existing in the simulation;

Step 170: the software indicates if there is any electrical defect, the simulation being redesigned according to the indication until passing the testing;

Step 180: after passing the testing, the PCB design is ready for manufacture.

Figure 2:
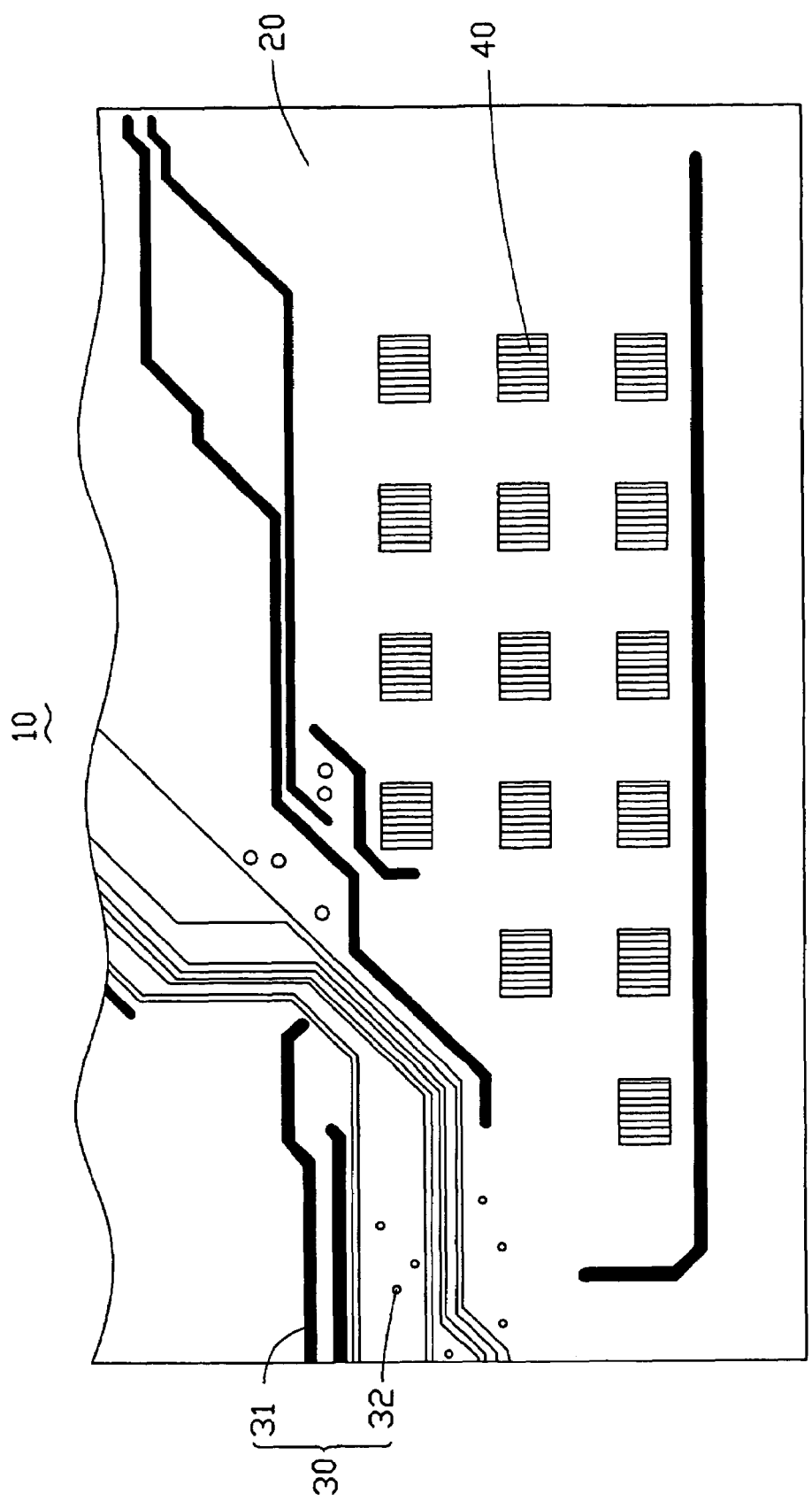
FIG. 2 is a top plan view of a PCB in accordance with the preferred embodiment of the present invention.
Figure 3:
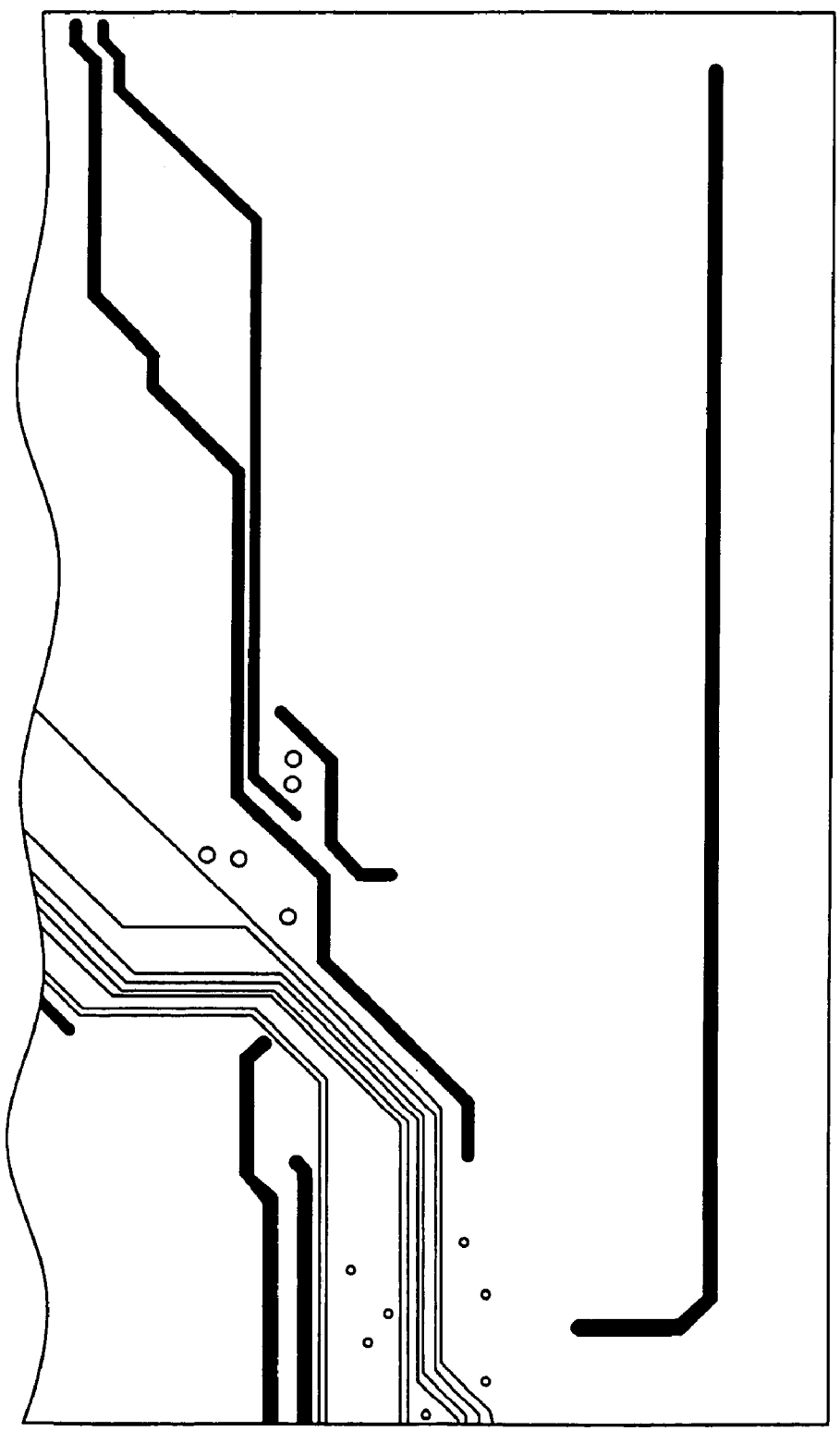
FIG. 3 is a top plan view of a conventional PCB.

Referring also to FIG. 2, a PCB 10 in accordance with a preferred embodiment of the present invention is provided via the above-mentioned steps. The PCB 10 includes a base board 20, a conductive pattern 30, and a plurality of metal pads 40. The base 20 often adopts an epoxy resin plate. The conductive pattern 30 is arranged on a top layer or a bottom layer of the base board 20, and includes a plurality of traces 31 and vias 32. The traces 31 are formed by etching a copper layer, and have different widths. The current strength passing through the traces 31 and the function of the traces 31 decide the widths of the traces 31. The vias 32 are defined for a plurality of electronic components. The electronic components are manually inserted into corresponding vias 32 of the PCB 10, and then soldered to the PCB 10. The metal pads 40 are arranged on the base board 20 where not covered with the copper layer, that is, where there are sparse traces 31. The metal pads 40 are arranged in an array, and each of them has a same size.

In the plating process of manufacturing the PCB 10, the metal pads 40 balance the current passing through the PCB 10, so that a plating thickness on an inner sidewall of each via can be uniform. The size and the quantity of the metal pads 40 is determined through simulation and testing using the software, in order to balance the current and prevent uneven plating thickness.

The designing method can be applied to a multi-layer PCB.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A method of making a printed circuit board (PCB) comprising the steps of:
   simulating a PCB in a software;
   simulating a plurality of electronic components on the simulated PCB;
   simulating a plurality of vias and traces connecting the simulated electronic components;
   simulating a plurality of metal pads on the simulated PCB where there is a sparsity of traces to balance a current passing through the simulated PCB;
   testing electrical characteristics of the simulation, if there is any electrical defect, the simulation is redesigned until passing the testing; and
   manufacturing a PCB according to the simulated PCB.

2. The method as claimed in claim 1, wherein the metal pads are evenly arrayed.

3. The method as claimed in claim 1, wherein size and quantity of the metal pads are determined through simulation and testing to balance the current.

4. The method as claimed in claim 1, wherein in the testing step the software indicates if there is any electrical defect, and the simulation is redesigned according to the indication until passing the testing.

5. A printed circuit board (PCB) comprising:
   a base board;
   a conductive pattern arranged on the base board, the conductive pattern comprising a plurality of vias and traces connecting the vias; and
   a plurality of metal pads arranged on an area of the base board where there are sparse vias and traces, wherein the metal pads are evenly arrayed to balance a current during a plating process for achieving an even plating thickness.

6. The PCB as claimed in claim 5, wherein each of the metal pads has a same size.

7. The PCB as claimed in claim 5, wherein the size and quantity of the metal pads are determined by testing in a simulated PCB.

8. A method for arranging circuitry on a printed circuit board (PCB), comprising the steps of:
   retrieving information of circuitry of a PCB;
   simulating said PCB in a system according to said information;
   identifying occupied areas of said PCB for an electrically conductive pattern to be installable onto said PCB; and
   balancing electrical characteristics of said PCB according to simulation of said PCB by means of attaching at least one electrically conductive pad to areas of said PCB other than said occupied areas for said pattern.

9. The method as claimed in claim 8, wherein said at least one electrically conductive pad comprises a plurality of metal pads arranged as an array in said other areas of said PCB.

* * * * *